United States Patent
Maydan et al.

[11] Patent Number: 5,885,358
[45] Date of Patent: Mar. 23, 1999

[54] GAS INJECTION SLIT NOZZLE FOR A PLASMA PROCESS REACTOR

[75] Inventors: Dan Maydan, Los Altos Hills; Steve S. Y. Mak, Pleasanton; Donald Olgado, Palo Alto; Gerald Zheyao Yin, Cupertino, all of Calif.; Timothy D. Driscoll, Hamilton, Mont.; James S. Papanu, San Rafael; Avi Tepman, Cupertino, both of Calif.

[73] Assignee: Applied Materials, Inc., Santa Clara, Calif.

[21] Appl. No.: 682,803

[22] Filed: Jul. 9, 1996

[51] Int. Cl.[6] .................................................. C23C 16/00
[52] U.S. Cl. .................. 118/723 R; 118/715; 118/723 I; 204/298.07; 427/248.1; 427/255.1; 427/255.2; 427/569
[58] Field of Search .............................. 118/715, 723 E, 118/723 MW, 723 I, 723 R; 204/298.07; 427/248.1, 255.1, 255.2, 255.3, 569; 156/345

[56] References Cited

U.S. PATENT DOCUMENTS

| | | | |
|---|---|---|---|
| 4,329,418 | 5/1982 | Kny et al. | 430/270 |
| 4,500,565 | 2/1985 | Hiramoto | 427/39 |
| 4,612,077 | 9/1986 | Tracy et al. | . |
| 4,717,584 | 1/1988 | Aoki et al. | 427/38 |
| 4,731,156 | 3/1988 | Montmarquet | 156/643 |
| 4,993,358 | 2/1991 | Mahawili | . |
| 5,074,456 | 12/1991 | Degner et al. | . |
| 5,178,904 | 1/1993 | Ishihara et al. | 427/523 |
| 5,188,671 | 2/1993 | Zinck et al. | 118/715 |
| 5,244,698 | 9/1993 | Ishihara et al. | 427/563 |
| 5,275,850 | 1/1994 | Kitoh et al. | 427/577 |
| 5,449,411 | 9/1995 | Fukuda et al. | 118/723 MP |
| 5,476,694 | 12/1995 | Ishihara et al. | 427/585 |
| 5,500,256 | 3/1996 | Watabe | . |
| 5,522,934 | 6/1996 | Suzuki et al. | 118/723 MR |
| 5,545,436 | 8/1996 | Saito | 427/255.3 |
| 5,643,394 | 7/1997 | Maydan et al. | 156/345 |
| 5,683,517 | 11/1997 | Shan | 118/723 E |
| 5,686,151 | 11/1997 | Imai et al. | 427/576 |
| 5,702,530 | 12/1997 | Shan et al. | 118/723 ME |
| 5,702,770 | 12/1997 | Martin | 427/475 |
| 5,746,875 | 5/1998 | Maydan et al. | 156/345 |

FOREIGN PATENT DOCUMENTS

| | | |
|---|---|---|
| 63-219129 | 9/1988 | Japan . |
| A-2-294029 | 12/1990 | Japan . |
| A-3-188627 | 8/1991 | Japan . |

*Primary Examiner*—R. Bruce Breneman
*Assistant Examiner*—Jeffrie R. Lund
*Attorney, Agent, or Firm*—Richard Lyon

[57] ABSTRACT

A gas injection system for injecting gases into a plasma reactor having a vacuum chamber with a sidewall, a pedestal for holding a semiconductor wafer to be processed, and a RF power applicator for applying RF power into the chamber. The gas injection system includes at least one gas supply containing gas, a gas distribution apparatus which has at least one slotted aperture facing the interior of the chamber, and one or more gas feed lines connecting the gas supply or supplies to the gas distribution apparatus. A preferred embodiment of a radial gas distribution apparatus in accordance with the present invention is disposed in the chamber sidewall and includes plural gas distribution nozzles each with a slotted aperture facing an interior of the chamber. Gas feed lines are employed to respectively connect each gas distribution nozzle to separate ones of the gas supplies.

30 Claims, 5 Drawing Sheets

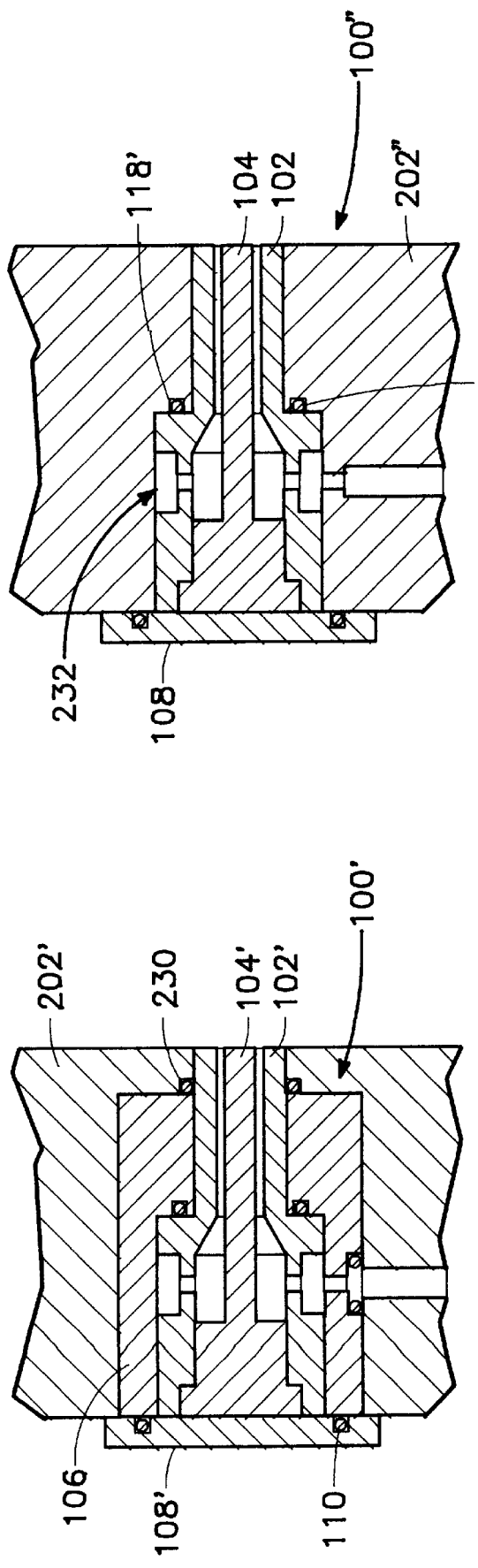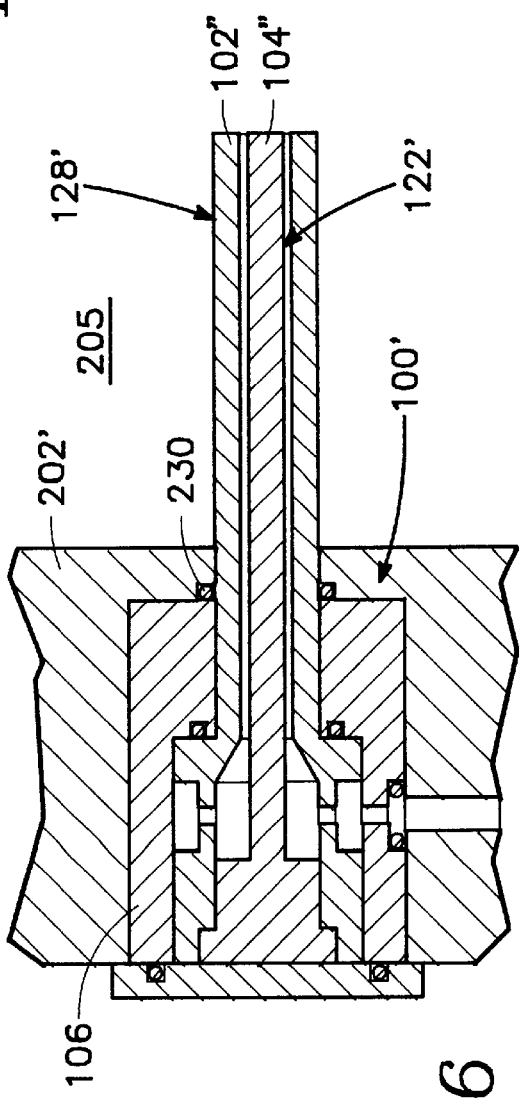
FIG. 4
FIG. 5
FIG. 6

GAS INJECTION SLIT NOZZLE FOR A PLASMA PROCESS REACTOR

BACKGROUND OF THE INVENTION

1. Technical Field

The invention is related to plasma reactors for processing semiconductor integrated circuit wafers and specifically to improvements in the gas injection system employed in such reactors.

2. Background Art

A plasma reactor for processing semiconductor integrated circuit wafers typically includes a vacuum chamber, a pedestal for supporting the wafer in the chamber, a plasma RF power source and a gas injection system for supplying gases to the chamber. If the reactor is an inductively coupled reactor, then it can include a coil antenna around the chamber connected to the plasma RF power source. The wafer pedestal can also be connected to the same or another RF power source. In other types of plasma reactors (such as, for example, a reactive ion etch reactor), there is no coil antenna and the plasma RF power source is connected solely to the wafer pedestal. The gas injection system of the reactor has one or more gas distribution apparatuses. If multiple gas distribution apparatuses are employed, each is typically disposed in a separate part of the reactor so as to provide gas to a different area within the chamber. The gas distribution apparatus (or apparatuses) utilized depends on the particular requirements of the process being performed. For example, one type of gas distribution apparatus is used to inject gas radially into the chamber from the reactor's sidewall, typically near the level of the wafer, during various processing operations (e.g. plasma enhanced chemical vapor deposition). This radial gas distribution apparatus may be used alone, or in combination with other gas distribution apparatuses, such as the aforementioned overhead type.

One typical radial gas distribution apparatus 10 is shown in FIG. 1. This apparatus 10 is located around the periphery of the base or bottom of a source region 12 of the chamber. The apparatus 10 includes a gas distribution ring 14 having gas injection holes 16 spaced periodically around the inward facing surface of the ring 14. Processing gas, or the like, is fed into the ring from a single inlet 18. Although sufficient for its designed task, the prior art radial gas distribution apparatuses 10 do have the disadvantage of requiring a considerable portion of the chamber to be physically dedicated to the gas distribution ring structure 14. In current plasma reactor designs there is a desire to package the reactor's numerous systems in as compact a unit as possible. Thus, giving up the space necessary to incorporate a large, intrusive gas distribution ring 14 presents a problem. In addition, the interface 20 between the reactor sidewall 22 and the gas distribution ring structure 14 is typically sealed to prevent gases from leaking through the interface. To accomplished this task, a relatively large sealing element (not shown) must be employed due to the extensive sealing surface area associated with the interface 20. As is well known, sealing large surfaces presents some difficulty, and leakage is a concern. For example, the dimensional tolerances associated with the surface against which a sealing element, such as a sealing O-ring, is seated must be relatively precise to prevent leak paths from forming. The larger the sealing surface, the more difficult it is to produce the required tolerances over its entire area.

Another concern associated with the interface between the reactor chamber sidewalls 22 and the relatively large prior art gas distribution rings 14 is the discontinuity the interface 20 creates in the wall surface. These discontinuities create stress points and fractures in the layer of deposition residue which inevitably forms on the chamber sidewalls 22. In addition, temperature gradients tend to form between the sidewalls 22 and the ring 14, further increasing the occurrence of stress fractures in the residue layer. The fractured residue material tends to flake off the ring 14 and sidewalls 22, thereby creating a risk of contaminating a wafer undergoing processing. This flaking phenomenon is particularly prevalent near the gas injection holes 16 where the turbulence caused by the incoming processing gas tends to disperse the flaked residue material into the chamber.

Asymmetric gas flow from the distribution ring 14 is also a problem encountered with existing radial gas distribution apparatuses. Since the gas distribution ring 14 is typically fed from one location, the gas flow from the gas injection holes 16 near that input can be much larger than at the opposite side of the ring. Such an asymmetric flow pattern can cause nonuniform etching or deposition on the semiconductor wafer. Also, with only one feed, if the gas is a composite of different gases, it must be premixed before it reaches the ring 14. There is no possibility of providing different gases from the various holes 16 in the ring 14 so as to allow mixing within the chamber or varying the composition of the gas in different parts of the chamber.

Thus, there is a need for a plasma reactor gas injection system which requires less space and has a smaller sealing surface area than currently available units. In addition, there is a need for a gas injection system which has the ability to provide a symmetrical gas flow to the chamber, and which can simultaneously deliver different gases to the chamber for mixing therein or varying the composition of the gas in different parts of the chamber.

SUMMARY

The present invention provides a gas injection system which fulfills the above-stated needs. Specifically, the present invention concerns a radial gas distribution apparatus disposed in the chamber sidewall and having plural gas distribution nozzles each with a slotted aperture facing the interior of the chamber. Plural gas feed lines are employed to respectively connect each gas distribution nozzle to separate ones of the gas supplies. Each of the gas supplies contains a gas which is supplied to the nozzles via the respective gas feed lines. The individual gas supplies can contain a gas made up of the same gaseous specie or species, or any one supply can contain a gas made of a different specie or species. In fact, all the supplies could contain a different type of gas. The ability to vary the composition of the gas in each supply allows each nozzle to deliver whatever gas is desired. Alternately, if there is no requirement to deliver different gases to the chamber, each of the nozzles could be connected to a single gas supply.

It is often desired that gas be delivered to the chamber in a uniform manner. To this end the gas distribution nozzles are equally space in relation one another around the perimeter of the chamber. In a preferred embodiment of the radial gas distribution apparatus there are four equally spaced gas distribution nozzles. In addition, a uniform gas distribution typically requires that the gas flow rate from each nozzle be approximately the same. Nozzles according to the present invention are capable of providing a range of gas flow rates. Thus, whenever a uniform gas distribution is required, all the nozzles are configured to produce the same flow rate. However, when a uniform gas distribution is not desired, each nozzle can be configured to provide differing gas flow rates. For example, providing a different flow rate form one or more of the nozzles could be used to compensate for an asymmetric pumping condition associated with the gas supply(ies). One way of establishing the differing gas flow rates is to vary the gas pressure in the gas supplies (where separate gas supplies are employed). Another way is to adjust the configuration of the nozzles themselves. This latter approach will be discussed below in connection with structure of the preferred nozzle configuration.

The preferred gas distribution nozzle includes a cylindrical inner member surrounded by an annular outer member such that an annular channel is formed therebetween. This annular channel terminates at a first end of the outer and inner members with an annular gap comprising the slotted aperture. Gas flows to the slotted aperture and into the chamber through the annular channel. In one embodiment of the present invention, each nozzle also includes a gas feed block having a bore therethrough into which the outer and inner members are disposed.

The outer member has an external annular cavity, which in combination with the sidewall of the gas feed block bore, forms a first manifold chamber. In addition, there are a plurality of holes through the outer member which provide a passageway for gas to flow from the first manifold chamber to the annular channel between the outer and inner members. Preferably, the holes are spaced equally around the circumference of the outer member to ensure a uniform flow of gas into the annular channel. This, in turn, ensures a uniform gas flow out of the slotted aperture. In addition, the number of holes and their diameters is chosen so as to provide a desired flow rate from each nozzle. Thus, if these parameters are varied between nozzles, the aforementioned variation in the flow rate between nozzles can be accomplished. Alternately, the number and diameter of the holes can be the same for every nozzle. In this case, flow restricting inserts could be disposed in the holes as needed to create the desired flow rate from each nozzle. The annular channel between the outer and inner members can also include a second manifold chamber corresponding to a location where the plurality of holes open into the annular channel. This second manifold chamber narrows at the end closest to the slotted aperture such that a remaining portion of the annular channel has cross-sectional dimensions approximately the same as the slotted aperture. The gas feed block has a gas feed hole with a first end which opens up to the exterior of the block and a second end which opens up into the first manifold chamber. One of the gas feed lines is connected to the first end of the gas feed hole so as to allow gas to flow through the gas feed hole to the first manifold chamber (and from there to the second manifold chamber, down the annular channel and out the slotted aperture into the reactor chamber).

The radial gas distribution apparatus is preferably sealed to prevent gases from leaking between the different parts of the nozzles, and between the nozzles and the chamber sidewall. Accordingly, various sealing devices, such as sealing O-rings are employed. One such sealing device prevents the passage of gases to or from the reactor chamber between the exterior of the outer member and the sidewall of the gas feed block bore. Another, prevents gases in the first manifold chamber and the annular channel from escaping to the outside of the nozzle along a path between the outer and inner members and/or the outer member and the sidewall of the gas feed block bore (or infiltrating from the outside to the interior of the nozzle by the same path). Still another sealing device is employed to prevent gases from the reactor chamber or outside the reactor from flowing through the interface between the exterior of each of the nozzles and chamber sidewall.

The outer and inner members of each of the gas distribution nozzles are preferably made of a material which is substantially impervious to attack from either the gas delivered by the nozzle, other gases existing with the reactor chamber, or by the impingement of plasma particles on the members. Preferably this impervious material is either a ceramic, fused quartz, or polymeric material.

Various alternate embodiments of the gas distribution nozzle configuration described above are also possible. For example, instead of disposing the outer member in the bore of a gas feed block and then incorporating the block into the chamber sidewall, an alternate embodiment of the present invention involves forming the bore previously associated with the gas block directly into the sidewall. Thus, the need for a gas feed block is eliminated. In another embodiment where a gas feed block is used, its forward face is exposed to the chamber. If this is the case, the block face would be susceptible to the corrosive effects of the plasma. One way to counteract this risk is to make the face or the entire block of one of the previously mentioned corrosion resistant materials. Alternately, the gas feed block can be embedded into the sidewall of the reactor. In this latter embodiment only a portion of the outer and inner members protrudes through the sidewall to the reactor chamber. The face of the gas feed block is not exposed.

Another variation of the previously described embodiments of the gas distribution nozzle has extended outer and inner members. In this variation, the ends of the outer and inner members facing the reactor chamber are extended radially inward from the sidewall towards the wafer pedestal. This extended nozzle configuration makes it possible to deliver gas closer to a wafer undergoing processing in the reactor. Delivering gas closer to the wafer is desirable in some processing operations as it can provide a more uniform distribution of the gas across the surface of the wafer. In addition, this configuration distances the gas flow away from the chamber walls, thereby eliminating turbulence near the chamber sidewalls which tends to disturb deposits thereon and disperse them into the chamber where they can contaminate the wafer being processed.

The radial gas distribution apparatus according to the present invention overcomes many of the disadvantages of the prior art devices, and offers versatility not found in these devices. For example, the relatively unobtrusive nozzle assemblies of the present invention require much less space within the chamber sidewall in comparison to the gas distribution rings typical of the prior art devices. The space freed up by using the nozzles can make the overall reactor more compact. The interfacing surfaces between the nozzles and the reactor sidewall are also quite small in comparison to the large interfacing surfaces associated with the prior art gas distribution rings. These smaller interfacing surfaces can be more easily sealed. For example, in the embodiment of the radial gas distribution apparatus having a gas feed block which is embedded into the sidewall of the reactor, only the end of the nozzle extends through the wall to the chamber. All that is needed to seal the interface between the reactor sidewall and the nozzle assembly is a small O-ring. Because the sealing surfaces are relatively small, the tolerances required to prevent leak paths are more easily maintained in comparison to the large interfacing surface between the gas distribution ring and reactor sidewall of prior art radial gas distribution apparatuses.

The preferred construction of the various embodiments of the present invention from materials impervious to attack by the plasma also offers a significant advantage over prior art gas distribution ring structures. If the prior art ring is made of aluminum, as is common, then it is susceptible to the corrosive effects of the etchant gases and the plasma, so must be replaced frequently. Stainless steel is sometimes used to fabricate the prior art rings, however, when this material is exposed to the plasma it can sputter unwanted heavy metal contaminants onto the wafer being processed. Of course, these problems could be avoided if the prior art rings are made from ceramic or some other corrosion resistant material similar to the embodiments of the present invention. However, the relatively large size of the prior art rings makes constructing them from such materials a problem. For example, large ceramic structures are very difficult to fabricate and tend to be fragile. These difficulties are particularly acute with large reactor chambers designed to process wafers having diameters of eight inches or more. The gas injection slit nozzles according to the present invention avoid these issues.

The previously discussed asymmetric gas flow problem associated with prior art gas distribution rings is also avoided by the present invention. Since gas is fed into the prior art distribution ring at a single point, the flow out of its nozzles near this input can be stronger than at more distant nozzles. However, according to the present invention, each nozzle has its own gas feed input. Therefore, if desired, the gas flow rate from each nozzle can be made identical, thereby producing a symmetric flow pattern within the chamber. Of course, if a symmetrical flow pattern is not desired, the radial gas distribution apparatus of the present invention is versatile in that it can be used to produce whatever flow rate a user wants from each of the respective nozzles. In addition, some embodiments are capable of providing different gases or different mixtures of gases from each of the respective nozzles. The prior art devices do not have this versatility to independently select a desired flow rate and gas composition for each nozzle.

In addition to the just described benefits, other objectives and advantages of the present invention will become apparent from the detailed description which follows hereinafter when taken in conjunction with the drawing figures which accompany it.

BRIEF DESCRIPTION OF THE DRAWINGS

The specific features, aspects, and advantages of the present invention will become better understood with regard to the following description, appended claims, and accompanying drawings where:

FIG. 4 is a cross-sectional view of a second embodiment of a slit nozzle for use in a radial gas distribution apparatus in which the nozzle has been embedded into the sidewall of a plasma reactor.

FIG. 5 is a cross-sectional view of a third embodiment of a slit nozzle for use in a radial gas distribution apparatus in which the gas feed block of previous embodiments has been eliminated.

FIG. 6 is an exemplary cross-sectional view of an alternate version of the slit nozzle embodiment of FIG. 4 wherein the outer and inner members of the nozzle have been extended into the reactor chamber.

DETAILED DESCRIPTION OF THE PREFERRED EMBODIMENTS

The present invention concerns the gas injection system for a plasma reactor. A plasma reactor gas injection system has one or more gas distribution apparatuses for distributing gas within the chamber. For example, a reactor can have an overhead gas distribution apparatus disposed in or adjacent the top of the reactor for distributing gas downward into the chamber. Such apparatuses are disclosed in the previously-identified parent to the present application (i.e. Ser. No. 08/307,888 filed Sep. 16, 1994) and in a co-pending patent application Ser. No. 08/551,881 filed Oct. 16, 1995. The reactor can also have a radial gas distribution apparatus disposed in or adjacent to the sidewall(s) of the reactor for distributing gas radially into the chamber. Preferred embodiments of a radial gas distribution apparatus according to the present invention will now be disclosed.

Figure 2A:
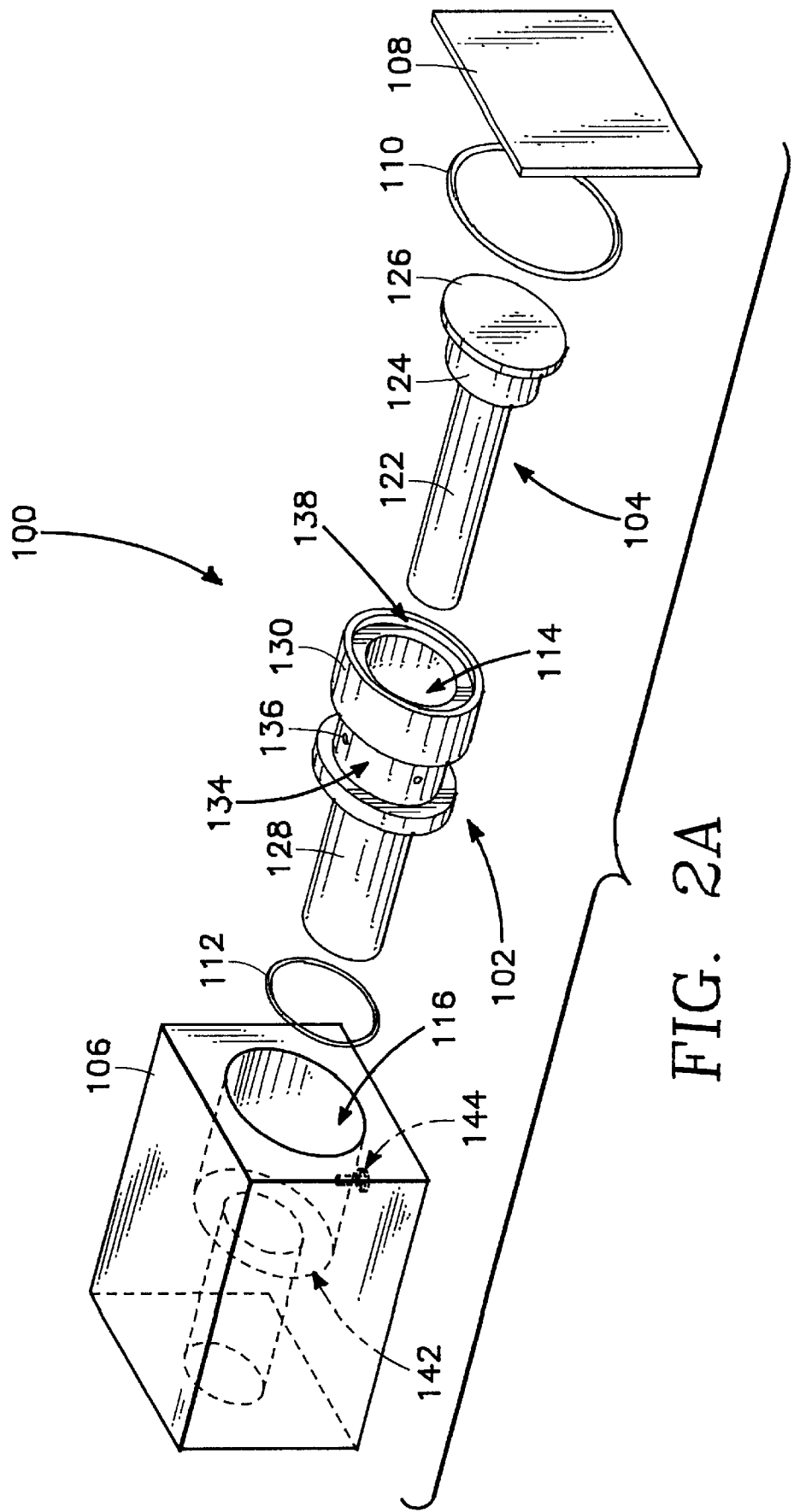
FIG. 2A is a perspective exploded view of a first embodiment of a slit nozzle for use in a radial gas distribution apparatus.
Figure 2B:
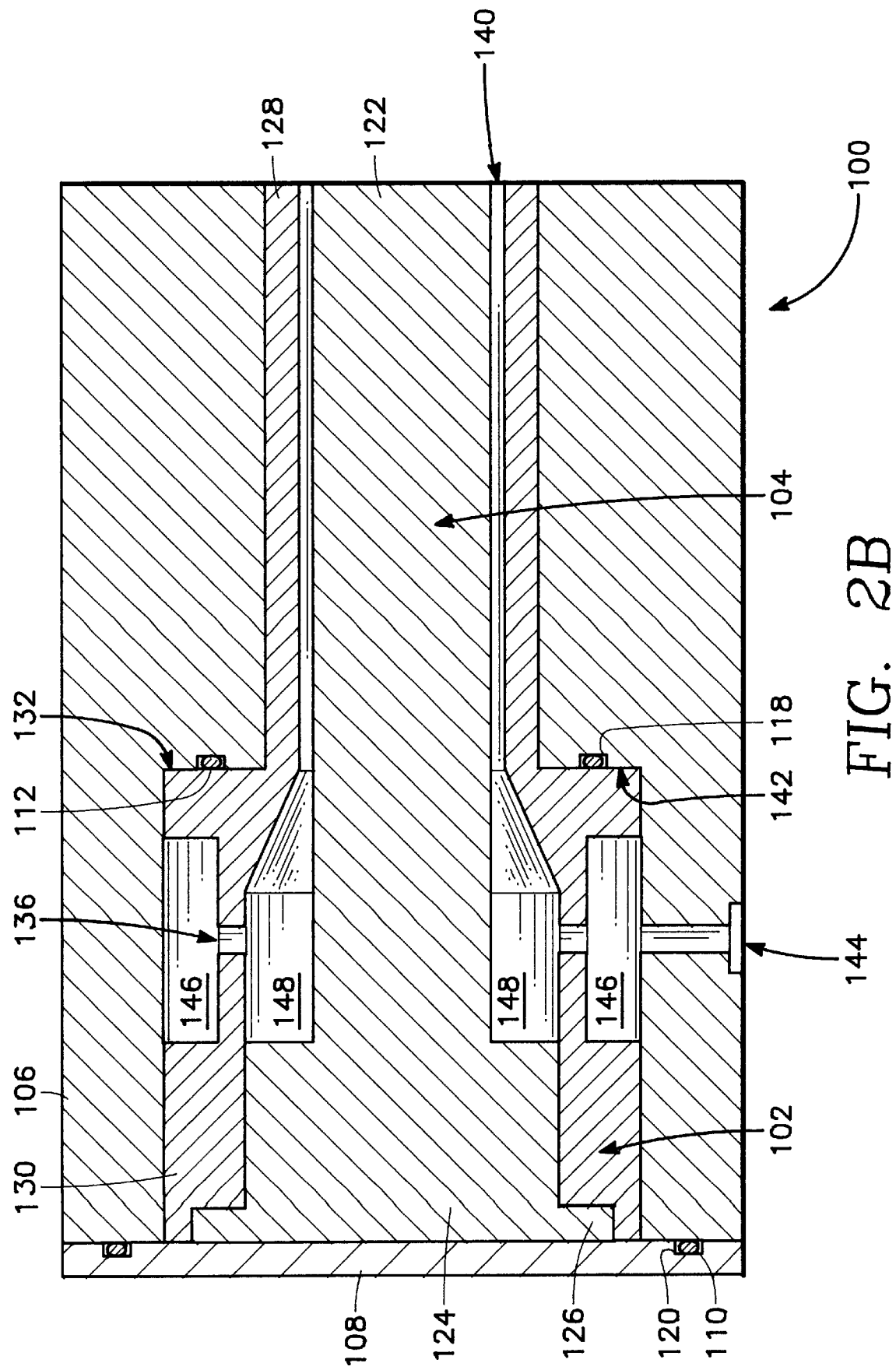
FIG. 2B is a cross-sectional view showing the assembled slit nozzle of FIG. 2A.

A preferred embodiment of the radial gas distribution apparatus employs one or more circular slit nozzles 100 (alternately referred to as slotted nozzles). FIGS. 2A–B depict one of these nozzles 100 and shows its preferred configuration. FIG. 2A is an exploded view of the nozzle 100 showing the parts that make it up and FIG. 2B is a cross-sectional view of the assembled nozzle structure. The nozzle 100 includes an outer member 102, an inner member 104, a gas feed block 106, a cover 108, and two sealing O-rings 110, 112. The inner member 104 is inserted into the central bore 114 of the outer member 102. This combined assembly is then inserted into the bore 116 of the gas feed block 106, after a sealing O-ring 112 is installed. Finally, the sealing O-ring 110 is installed in a groove 120 (shown in FIG. 2B) in the back surface of the cover 108, and the cover 108 is installed on the gas feed block 106. The cover 108 can be secured in any appropriate fashion, such as by screws (not shown).

The inner member 104 has the shape of a stepped cylinder. Starting at its end opposite the cover 108, the inner member 104 has a long cylindrical end section 122 which transitions into a shorter cylindrical middle section 124 of a larger diameter. The inner member 104 terminates with a disk-shaped end cap 126 which has an even larger diameter. The end section 122, middle section 124, and end cap 126 are all concentric with one another.

The outer member 102 has the shape of a stepped hollow cylinder open at both ends. Starting with the end opposite the cover 108, the outer member 102 has a long cylindrical sleeve 128 which transitions into a concentric cylindrical manifold section 130. The manifold section 130 has a larger outer diameter than the sleeve 128, thereby producing a flat annular surface 132 (shown in FIG. 2B) at the transition point. The exterior of the manifold section 130 includes an annular cavity 134. Spaced periodically around the bottom of this annular cavity 134 are holes 136 which extend to the central bore 114 of the outer member 102. The central bore 114 has an initial diameter corresponding with the inner diameter of the sleeve 128 at the aforementioned transition point. From there, the central bore 114 tapers outward to larger diameter near where the holes 136 open up into the bore 114. The remaining length of the central bore 114 exhibits this larger diameter with the exception of an end pocket 138 which has an even larger diameter.

The disk-shaped end cap 126 and the cylindrical middle section 124 of the inner member 104 respectively fit into the end pocket 138 and a portion of the of the central bore 114. It is preferred that the dimensions of the inner member's cylindrical middle section 124 and the portion of the bore 114 with which it interfaces have a tight fit, although not a jam fit. This sizing ensures that the outer and inner members 102, 104 can be easily assembled, and that the long end section 122 of the inner member 104 extends away from the middle section 124 concentric with the longitudinal axis of the outer member's central bore 114. This concentric alignment is necessary to ensure the slotted aperture 140 (shown in FIG. 2B) formed by the ends of the inner and outer members has a uniform width. The end cap 126 and end pocket 138 are designed to prevent longitudinal movement of the inner member 104 further into the outer member 102. Therefore, as long as the diameter of the end cap 126 is large enough to butt against the back of the pocket 138, a tight fit is not required. Further, the thickness of the end cap 126 and the depth of the pocket 138 may be approximately equal so that the ends of these structures adjacent the cover 108 are flush with one another, or alternately the end cap 126 can be slightly thicker than the pocket 138. This latter configuration is preferred as it ensures the cover 108 will fully contact the end cap 126 and push the inner member 104 firmly into the outer member 102, regardless of any small tolerance mismatch between the nozzle components or the force of the sealing O-ring 110 on the cover 108. The middle section 124 of the inner member 104 extends into the outer member 102 no further than the point where the holes 136 open up into the central bore 114. In this way, gas flow through the holes 136 (as will be discussed in detail later) will not be impeded. The long end section 122 of the inner member 104 extends from the middle section 124 through the remaining portion of the bore 114 of the outer member 102. The long end section 122 terminates flush with the end of the sleeve portion 128 of the outer member 102 and forms the aforementioned slotted aperture 140 at that point. The inner diameter of the sleeve section 128 and the diameter of the long end section 122 are preferably such that the aperture 140 formed thereby has a width of between about 0.010 and 0.030 inches (ideally about 0.020 inches) and a diameter measured from the outside periphery between about 0.30 and 1.00 inches (ideally about 0.40 inches).

The gas feed block 106 has a stepped central bore 116. A forward section of this bore 116 has a diameter approximately corresponding to that of the exterior of the sleeve portion 128, although slightly larger to facilitate the insertion of the sleeve portion into the block 106. A tight fit is preferred, although not a jam fit. In addition, the length of the forward section of the bore 116 is approximately the same as the sleeve portion 128 in this embodiment of the invention. Thus, when installed, the ends of the sleeve portion 128 and the long end section 122 of the inner member 104 are approximately flush with the front of the gas feed block 106. The gas feed block bore 116 also has a rear section having a larger diameter than the forward section. This larger diameter approximately corresponds to the exterior diameter of the manifold section 130 of the outer member 102, although slightly larger. Here again, the fit between the manifold section 130 of the outer member 102 and the rear section of the gas feed block bore 116 is preferably tight, but not a jam fit. The reason a tight, but non-jam, fit is preferred between gas feed block bore 116 and the outer member 102 is that such a fit provides proper alignment of these elements, without hindering their assembly or disassembly. The transition between the forward and rear sections of the gas feed block bore 116 forms an internal face 142. This face 142 can have a groove 118 into which the sealing O-ring 112 is installed, as shown in FIG. 2B. Alternately, although not shown in the figure, the O-ring 112 could have an inner diameter such that it is capable of being slid over the sleeve portion 128 of the outer member 102 until it abuts the member's flat annular surface 132. In addition, there would be no groove formed in the internal face 142 of the gas feed block bore 116. Rather, the O-ring 112 would be a compression O-ring which would deform to seal the interface between the surface 132 and the internal face 142. It is also noted that the face 142 provides a stop for the flat annular surface 132, thus preventing further insertion of the outer member 102 into the block 106. The length of the gas-feed block's rear bore section approximately corresponds to the length of the manifold section 130 of the outer member 102, thereby making the rearward facing surfaces of the end cap 124, manifold section 130, and gas feed block 106, flush with one another. There is also a gas feed hole 144 through the bottom of the block 106. This gas feed hole 144 opens up into the annular cavity 134 of the manifold section 130 (when installed in the block 106).

The inward and outward facing sides of the cover 108 have the same general size and shape as the rearward face of the gas feed block 106. The inward facing side of the cover 108 has an annular groove 120 into which a sealing O-ring 110 is installed prior to attaching the cover 108 to the gas feed block 106. The cover 108 is attached to the rearward face of the gas feed block 106 by any appropriate means (e.g. screws). Once installed, the cover 108 acts to hold the outer member 102 up against the face 142 in the gas feed block bore 116, and to provide a compressive force to the O-ring 112. In addition, the cover 108 holds the inner member 104 within the outer member 102 and forces the sealing O-ring 110 against the gas feed block 106.

In operation, gas is fed into the exterior end of the gas feed hole 144 in the gas feed block 106. The gas travels through the hole 144 and into the manifold chamber 146 formed by the annular cavity 134 of the outer member 102 and the interior surface of the gas feed block 106. The gas then flows around the manifold chamber 146 and through the holes 136 at the bottom of the annular cavity 134. Consequently, the gas enters a second manifold chamber 148 formed between the inner surface of the manifold section 130 and the outer surface of the long end section 122 of the inner member 104. From there, the gas flows down the annular space between the interior surface of the sleeve section 128 of outer member 102 and the exterior surface of the long end section 122. Finally, the gas exits from the slotted aperture 140 formed at the forward end of the nozzle 100. The O-ring 112 between the outer member 102 and the gas feed block 106 prevents gas from flowing along a path between the sleeve portion 128 and the interior surface of the gas feed block 106. The sealing O-ring 110 between the rear face of the gas feed block 106 and the cover 108 provides a vacuum seal and prevents gas from flowing between the exterior surface of the manifold section 130 and the adjacent interior surface of the gas feed block 106. In view of the task required of the sealing O-ring 110, it is preferred that any cover attachment means (such as screws) which would create a leak path through the cover be incorporated outside the periphery of the sealing O-ring 110. In this way, any potential leak path via the attachment means is avoided.

Figure 3:
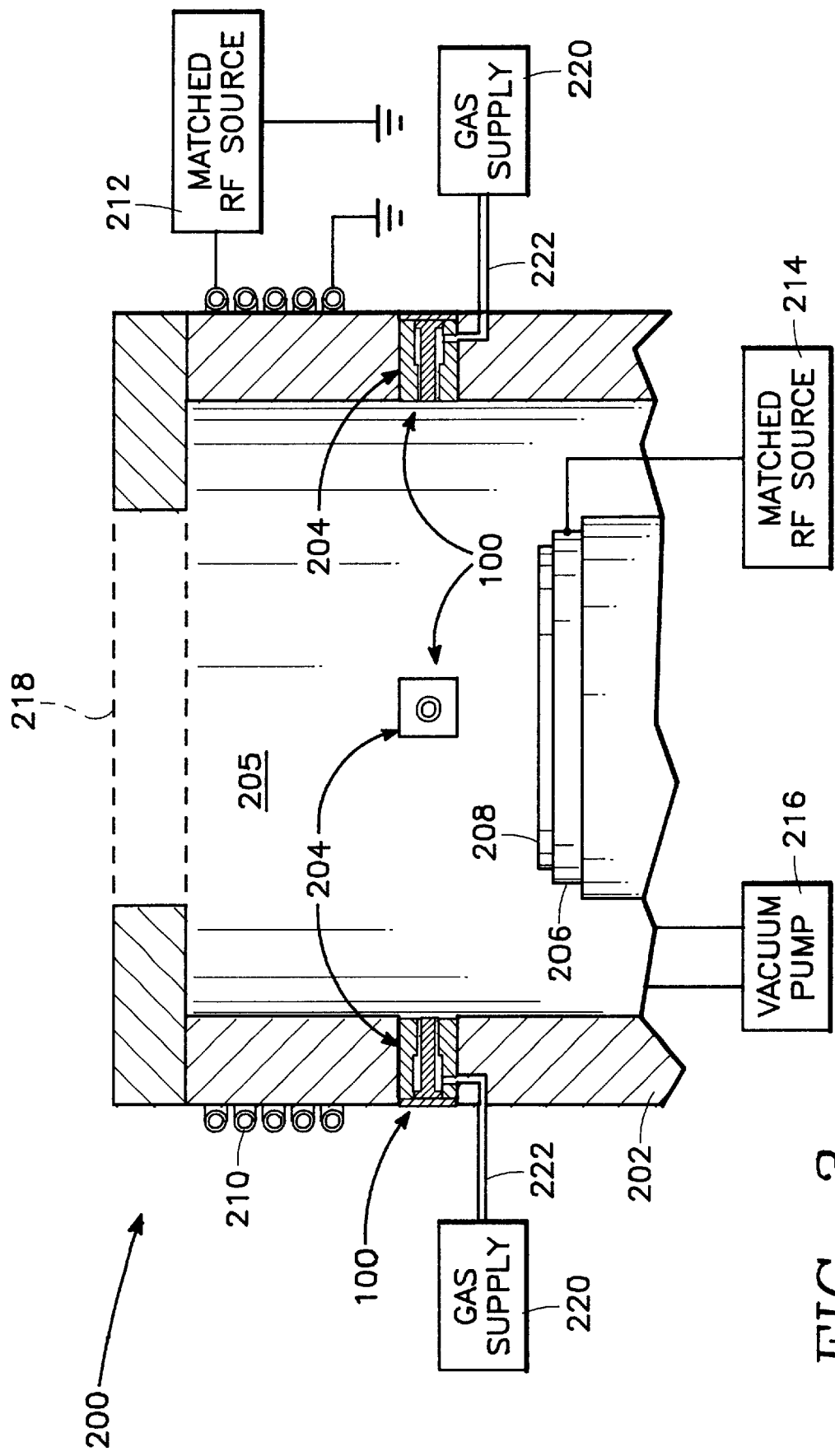
FIG. 3 is a cross-sectional view of a part of a plasma reactor incorporating four slit nozzles of the type depicted in FIGS. 2A–B.

FIG. 3 illustrates a plasma reactor 200 having a radial gas distribution apparatus in accordance with the present invention. In this case four equally spaced slotted nozzles 100 have been incorporated into the sidewall 202 of a cylindrical reactor housing. The nozzles 100 may be secured to the reactor housing by any appropriate means, and the interface 204 between each nozzle 100 and the sidewall 202 may be sealed in any well known manner to prevent gases from leaking out through the interface. The reactor 200 also includes a wafer pedestal 206 supporting a semiconductor wafer 208 which is to be processed. A RF coil antenna 210 wrapped around the reactor housing is powered by a matched RF source 212. A RF power source 214 is also connected to the wafer pedestal 206. However, other power source configurations may be employed. For example, a magnetically enhanced reactive ion etch apparatus can be employed in which the RF antenna coil and RF source are replaced with electromagnetic coils and the power is input only to the wafer pedestal 206. A vacuum pump 216 and throttle valve (not shown) control the chamber interior gas pressure. Although, the reactor depicted in FIG. 3 has four nozzles 100, it is not intended that the present invention be limited to such an embodiment. Rather, any number of nozzles 100 may be employed, as desired. In addition, the reactor of FIG. 3 may also include an overhead gas distribution apparatus 218. This element is shown in dashed lines to indicate that it is optional.

Figure 1:
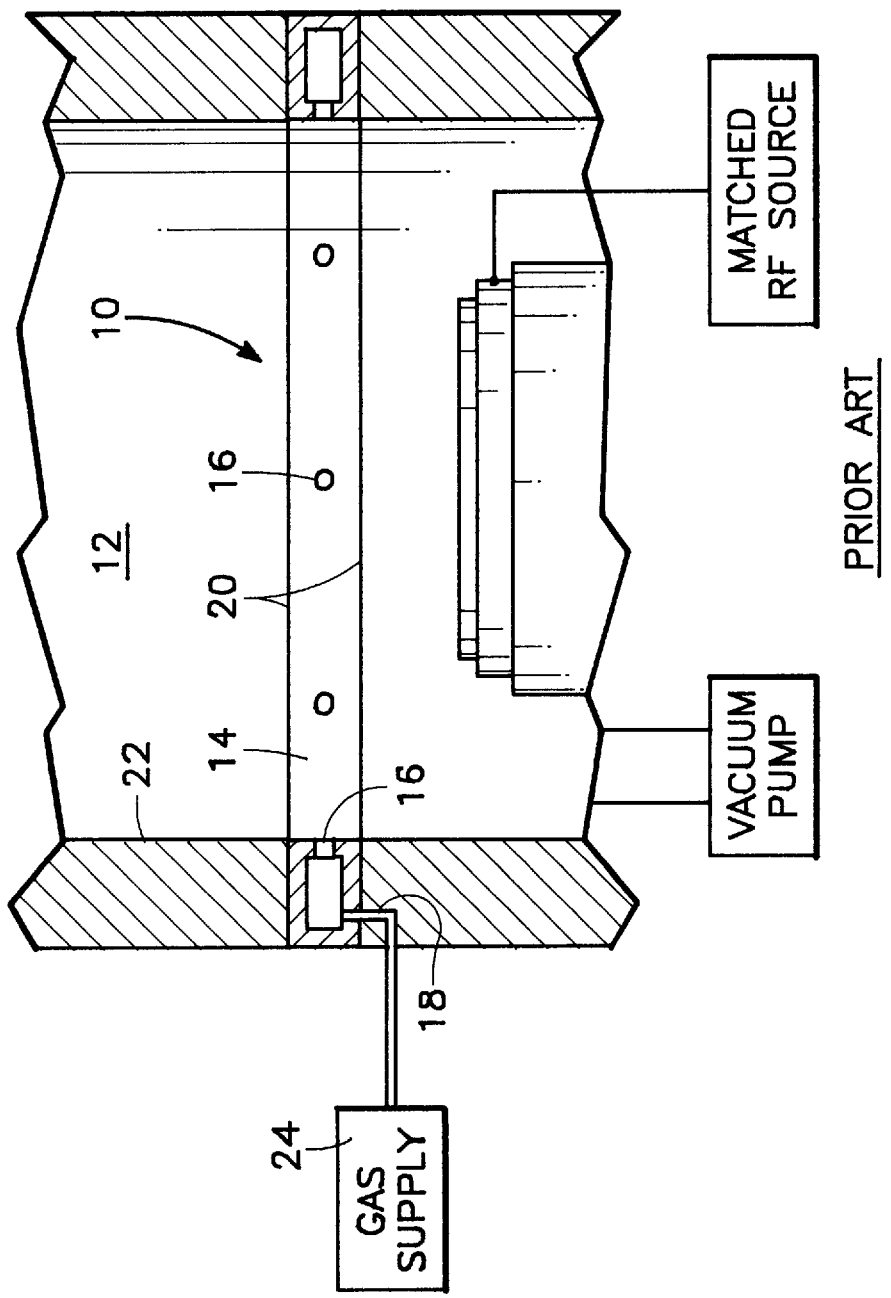
FIG. 1 is a cross-sectional view of a part of a plasma reactor showing a typical prior art radial gas distribution apparatus employing a gas distribution ring.

A gas supply 220 is connected through inlet tubes 222 to each of the slotted nozzles 100 in FIG. 3. Each nozzle 100 can have its own gas supply 220 (as shown), or any number of nozzles 100 can share a gas supply. However, the depicted embodiment where each nozzle 100 has its own gas supply 220 has some significant advantages. This configuration allows a different gas or mixture of gasses to be disbursed from each nozzle 100. One potential use for such a feature is to deliver specific gases to a portion of the reactor chamber 205 where they are needed, exclusive of the other areas. For example, if it were determined that the concentration of an etchant species was too low in one area of the chamber 205, the nozzle 100 closest to that area could be supplied with a gas mixture richer in the etchant species than provided to the other nozzles. Another use for the separate gas supply feature might be to supply different gases from the nozzles 100. These gases could be designed to react with one another within the reactor chamber 205. Prior art radial gas distribution apparatuses (such as shown in FIG. 1) employing single-feed gas distribution rings 14 are incapable of accomplishing the above tasks. Since a single gas feed 18 and single gas supply 24 is typically employed with the prior art devices, the gases supplied to the chamber 12 must be premixed. Accordingly, different gases or gas concentrations can not be simultaneously supplied to the chamber 12.

Referring again to FIGS. 2A–B, portions of the slotted nozzles 100 are preferably formed of a material impervious to attack by the plasma or by gaseous species present in the gas injected into the reactor chamber through the nozzles 100. A preferred material is ceramic, such as alumina, sapphire, aluminum nitride, silicon nitride, or various glass-ceramic materials. However, fused quartz (or any suitable vitreous silica), and polymeric materials such as polyimide and polyetherimide, could be employed as well. Specifically, it is preferred that at least the outer and inner members 104, 106 be made of one of these corrosion resistant materials. The embodiment of the nozzle 100 depicted in FIG. 3 also shows that the front face of the gas feed block 106 (of FIGS. 2A–B) is exposed to the interior of the chamber 205. Accordingly, it is preferred that this front face (or the entire of the gas feed block 106), as with any surface coming in contact with the corrosive processing gases, be made of a corrosion resistant material.

Alternately, the gas feed block 106 could be embedded into the reactor sidewall 202' such that only the forward ends of the outer and inner members 102', 104' protrude through the sidewall 202' to the reactor chamber, as shown in FIG. 4. This allows the gas feed block 106 to be fabricated from a material that is not necessarily resistant to sputtering as it will isolated from the plasma. For example, the gas feed block 106 can be made of stainless steel. The use of this material facilitates the fabrication of the block as it is relatively easy work with in comparison to ceramic and the like. In addition, stainless steel provides the added advantage of being resistant to the corrosive effects of the processing gas flowing though the block 106. This design also simplifies the sealing the interface between the nozzle 100' and the reactor sidewall 202'. As shown in FIG. 4, all that is needed to seal the interface is the relatively small O-ring 230. It is pointed out, however, that the ends of the outer and inner members 102', 104' of the nozzle 100' which face the interior of the reactor must be extended beyond the forward face of the gas feed block 106 so as to project through the sidewall 202' to the interior of the reactor. In the depicted embodiment, the ends of the outer and inner members 102', 104' are made flush with the interior surface of the reactor's sidewall 202'. Note also that the cover 108' has been modified to attach to the exterior of the reactor's sidewall 202'. This simplifies the installation and securing of the nozzle 100' into the sidewall 202' of the reactor. In addition, the exterior-facing surfaces of the outer member 102', inner member 104', and the gas feed block 106 have been made approximately flush with the exterior surface of the reactor sidewall 202', so that the sealing O-ring 110 still contacts the surface of the block 106. Because of the foregoing advantages, the embodiment of the invention depicted in FIG. 4 is considered the most preferred.

Another alternate embodiment of the nozzle 100" in accordance with the present invention eliminates the gas feed block. Instead, as shown in FIG. 5, the reactor sidewall 202" itself is modified to incorporate a bore and gas feed hole (having the same dimensions as the bore 116 and gas feed hole 144 associated with the gas feed block 106 of FIGS. 2A–B). The outer and inner members 102, 104 are then installed into the bore in the reactor sidewall 202". In this alternate embodiment, the cover 108 would be attached to the outside of the reactor sidewall 202". The interface between the nozzle assembly 100" and the reactor sidewall 202" is sealed by O-ring 112 which is disposed in the annular groove 118'. However, it must be noted that this embodiment would not be preferred where the reactor sidewall 202" is made of anodized aluminum, or the like, since a portion 232 thereof would be in direct contact with the processing gas and susceptible to its corrosive effects.

In any of the previously-described embodiments of the slotted nozzle of the present invention, the sleeve portion 128' of the outer member 102" and the long cylindrical end section 122' of the inner member 104" could be lengthened so as to extend into the chamber 205, as shown in FIG. 6 (using the embodiment of FIG. 4 as an example). The extended nozzle embodiment of the present invention makes it possible to distribute gases closer to a semiconductor wafer being processed in the reactor. Delivering processing gas closer to the wafer is desirable in some processing operations as it can provide a more uniform distribution of the gas across the surface of the wafer. In addition, this configuration substantially eliminates turbulence near the chamber sidewalls caused by the flow of gas from the nozzles. This is advantageous as the turbulence tends to disturb deposition residue covering the chamber sidewalls and disperse flakes of the material into the chamber where they can contaminate the wafer being processed.

Referring once again to FIGS. 2A–B, the holes 136 are employed to facilitate a uniform disbursement of gas into the second manifold chamber 148. Preferably, these holes 136 are equally spaced around the circumference of the outer member 102. The first manifold chamber 146 is employed to smooth out the potentially jet-like flow from the gas feed block hole 144 and to distribute it throughout this first chamber 146. Likewise, the second manifold chamber 148 is used to smooth out the potentially jet-like flow pattern emanating from the holes 136 and to distribute the gas throughout the second chamber 148. The net result of the interaction of the two manifold chambers 146, 148 and the equally spaced holes 136 is to ensure a generally uniform gas flow out of the slotted aperture 140 of the nozzle 100.

The number of holes 136 and their diameters, in conjunction with the size of the slotted aperture 140, will substantially determine the gas flow rate from the nozzle 100 (for a given gas supply pressure). Thus, one way of establishing a desired flow rate is to vary the number of holes 136. In general, the more holes 136 employed, the greater the flow rate. Another way to establish the desired flow rate would be to vary the diameter of the holes 136. In this case, large diameters will generally produce a greater flow rate. However, as discussed above, it is also preferred that the outer member 102 be made of a corrosion resistant ceramic, fused quartz, or polymeric material. Mechanical and fabrication constraints associated with these materials may limit the diameter of the holes 136, as well as the number of holes 136. Specifically, it is difficult to form relatively small holes in these types of materials (as compared to most metals). The smallest hole that can be practically formed would be approximately 0.030 to 0.050 inches in diameter. However, larger holes sizes could be formed to accommodate the mechanical and fabrication constraints by employing flow restricting inserts (not shown) fitted into the holes to accomplish the task of restricting the gas flow. The construction and factors determining the design of an appropriate insert for the aforementioned task are well known to persons skilled in the art and do not constitute a novel aspect of the present invention. Accordingly, no detailed description of these inserts will be provided herein. Additionally, the structural integrity of the outer member 102 in the vicinity of the holes 136 should be taken into consideration. There must not be so many holes 136 that the member 102 becomes difficult to manufacture or unduly fragile. Regardless of the aforementioned mechanical and fabrication constraints, it is believed that any currently desired gas flow rate can be produced by varying the number of holes 136, their diameters, and/or through the use of inserts.

In a tested embodiment each nozzle had four holes 136 with a diameter of approximately 0.20 inches. The inner diameter of the sleeve portion 128 of the outer member 102 and the diameter of the long end portion 122 of the inner member 104 were chosen to provide a 0.40 inch aperture diameter with a 0.02 inch aperture width. No inserts were incorporated. It was found that this configuration provided a uniform gas flow pattern and an acceptable gas flow rate (i.e. about 150–200 sccm) from the nozzle 100.

Although the desired flow rate would usually be the same for each nozzle 100 to provide a uniform distribution of gas within the reactor chamber, this need not be the case. It may be beneficial in some circumstances to have different flow rates from each of the nozzles 100. For example, in the embodiment of the present invention shown in FIG. 3, each nozzle 100 has a separate gas supply 220 and apparatus is capable of providing different gases from each of the nozzles. It can be beneficial to adjust the individual nozzle flow rates to ensure that a desired concentration of each gas is supplied to the chamber 205. Varying the flow rate from one nozzle 100 to the next could be accomplished by varying the number of holes 136, and/or their diameters, as described above. In addition, the aforementioned inserts might be employed for this purpose. The pressure of the gas from each supply 220 could also be varied to produce the desired flow rates.

While the invention has been described in detail by specific reference to preferred embodiments thereof, it is understood that variations and modifications thereof may be made without departing from the true spirit and scope of the invention.

What is claimed is:

1. A plasma reactor comprising:

a reactor chamber having a sidewall;

a pedestal for holding a wafer to be processed; and a gas injection system, comprising, plural gas supplies, each containing at least one process gas, a gas distribution apparatus disposed in said chamber sidewall, said gas distribution apparatus comprising plural gas distribution nozzles each with an annular slotted aperture facing an interior of the chamber, and plural gas feed lines wherein ones of the gas distribution nozzles are connected to ones of the gas supplies by ones of the gas feed lines.

2. The reactor of claim 1 wherein the gas distribution nozzles are equally spaced in relation to one another around the perimeter of the chamber.

3. The reactor of claim 1 wherein each of the gas distribution nozzles comprises a cylindrical inner member surrounded by an annular outer member such that an annular channel is formed therebetween which terminates at a first end of the inner member and a first end of the outer member with an annular gap comprising the slotted aperture, said annular channel allowing gas to flow to the slotted aperture and into the reactor chamber.

4. The reactor of claim 3 wherein each of the gas distribution nozzles further comprises a gas feed block having a bore therethrough into which the outer member is disposed.

5. The reactor of claim 4 wherein the outer member comprises, an external annular cavity which in combination with a sidewall of the gas feed block bore forms a first manifold chamber, and a plurality of holes which provide a passageway for gas to flow from the first manifold chamber to the annular channel between the outer and inner members.

6. The reactor of claim 5 wherein the outer member holes are spaced equally around the circumference of the outer member.

7. The reactor of claim 5 wherein a number and diameter of the outer member holes is chosen so as to provide a desired flow rate of gas from the slotted aperture of each nozzle.

8. The reactor of claim 5 wherein the annular channel between the outer and inner members comprises a second manifold chamber corresponding to a location where the plurality of holes open into the annular channel.

9. The reactor of claim 8 wherein the second manifold chamber narrows at an end closest to the slotted aperture such that a remaining portion of the annular channel has cross-sectional dimensions approximately the same as the slotted aperture.

10. The reactor of claim 5 wherein:
   the gas feed block further comprises a gas feed hole having a first end which opens up to the exterior of the block and a second end which opens up into the first manifold chamber; and
   a one of the gas feed lines is connected to the first end of the gas feed hole so as to allow gas to flow through the gas feed hole to the first manifold chamber.

11. The reactor of claim 5 further comprising sealing means for preventing the passage of gases between the exterior of the outer member and the sidewall of the gas feed block bore.

12. The reactor of claim 5 further comprising sealing means for preventing the passage of gases into the nozzle from the exterior of the reactor.

13. The reactor of claim 5 wherein there are four outer member holes, each with a diameter of approximately 20 inches.

14. The reactor of claim 4 wherein the gas feed block of each of the gas distribution nozzles is embedded into the sidewall of the reactor and only a portion of the outer and inner members protrudes through the sidewall to the reactor chamber.

15. The reactor of claim 3 wherein the outer member is disposed within a bore in the chamber sidewall.

16. The reactor of claim 3 wherein a portion of the outer and inner members extends radially away from the sidewall into the chamber towards the pedestal.

17. The reactor of claim 3 wherein the outer and inner members of each of the gas distribution nozzles comprises a material substantially impervious to attack from said at least one process gas and from other gases existing with the reactor chamber.

18. The reactor of claim 17 wherein said substantially impervious material comprises one of: (a) ceramic materials, (b) fused quartz, (c) polymeric materials.

19. The reactor of claim 1 further comprising sealing means for preventing the passage of gases between the exterior of each of the nozzles and chamber sidewall to the exterior of the reactor.

20. The reactor of claim 1 wherein each of the plural gas supplies is capable of containing a different gas or mixture of gases, and exhibiting a different pressure.

21. The reactor of claim 1 wherein each of the gas distribution nozzles is capable of providing a different rate of gas flow into the chamber.

22. The reactor of claim 1 wherein the slotted aperture of each of the gas distribution nozzles has a diameter generally in the range of about 0.30 inches to about 1.00 inches.

23. The reactor of claim 1 wherein the slotted aperture of each of the gas distribution nozzles has a width generally in the range of about 0.010 inches to about 0.030 inches.

24. The reactor of claim 1 wherein there are four gas distribution nozzles.

25. A plasma reactor comprising:
   a reactor chamber having a sidewall;
   a pedestal for holding a wafer to be processed;
   a gas injection system, comprising,
      a gas supply containing at least one process gas,
      a gas distribution apparatus disposed in said chamber sidewall, said gas distribution apparatus comprising plural gas distribution nozzles each with an annular slotted aperture facing an interior of the chamber, and
      plural gas feed lines wherein each one of the gas distribution nozzles is connected to the gas supply by a one of the gas feed lines.

26. The reactor of claim 25 wherein of the gas distribution nozzles comprises a material substantially impervious to attack from said at least one process gas and from other gases existing with the reactor chamber.

27. The reactor of claim 26 wherein said substantially impervious material comprises one of: (a) ceramic materials, (b) fused quartz, (c) polymeric materials.

28. The reactor of claim 25 wherein there are four gas distribution nozzles.

29. In a plasma reactor comprising a reactor chamber having a sidewall, a pedestal for holding a wafer to be processes, and a gas injection system comprising plural gas supplies and a gas distribution apparatus having plural distribution nozzles each with an annular slotted aperture facing an interior of the chamber ones of which are connected to ones of the plural gas supplies, a method of employing the gas injection system comprising the step of:
   providing a gas flow from each of the gas distribution nozzles having said annular slotted aperture, said gas flow capable of being at a different flow rate for each of the nozzles.

30. In a plasma reactor comprising a reactor chamber having a sidewall, a pedestal for holding a wafer to be processes, and a gas injection system comprising plural gas supplies and a gas distribution apparatus having plural distribution nozzles each with an annular slotted aperture facing an interior of the chamber ones of which are connected to ones of the plural gas supplies, a method of employing the gas injection system comprising the step of:
   emitting a gas from each of the gas distribution nozzles having said annular slotted aperture, said gas capable of being one of (I) a different gaseous species, and (ii) a different mixture of gaseous species, for each of the nozzles.

* * * * *